(12) United States Patent
Heidari

(10) Patent No.: US 7,022,465 B2
(45) Date of Patent: Apr. 4, 2006

(54) METHOD IN CONNECTION WITH THE PRODUCTION OF A TEMPLATE AND THE TEMPLATE THUS PRODUCED

(75) Inventor: Babak Heidari, Furulund (SE)

(73) Assignee: Obducat Aktiebolag, Malmo (SE)

( * ) Notice: Subject to any disclaimer, the term of this patent is extended or adjusted under 35 U.S.C. 154(b) by 196 days.

(21) Appl. No.: 10/296,326

(22) PCT Filed: Apr. 10, 2001

(86) PCT No.: PCT/SE01/00787

§ 371 (c)(1), (2), (4) Date: Jan. 22, 2003

(87) PCT Pub. No.: WO01/90816

PCT Pub. Date: Nov. 29, 2001

(65) Prior Publication Data

US 2003/0139042 A1  Jul. 24, 2003

(30) Foreign Application Priority Data

May 24, 2000  (SE)  ..................... 0001931

(51) Int. Cl.
*G03F 7/00* (2006.01)
(52) U.S. Cl. ....................... 430/320; 430/330
(58) Field of Classification Search ................. 430/198, 430/322–326, 330, 320; 264/219–227, 241, 264/248; 355/75

See application file for complete search history.

(56) References Cited

U.S. PATENT DOCUMENTS

| | | | | |
|---|---|---|---|---|
| 3,954,469 A | * | 5/1976 | Avanzado et al. | ........... 430/320 |
| 4,336,320 A | * | 6/1982 | Cummings et al. | ......... 430/198 |
| 5,116,271 A | * | 5/1992 | Arimoto | ....................... 445/24 |
| 5,162,078 A | | 11/1992 | Bley et al. | |
| 5,298,366 A | * | 3/1994 | Iwasaki et al. | .............. 430/321 |
| 5,494,782 A | * | 2/1996 | Maenza et al. | .............. 430/321 |
| 5,512,131 A | | 4/1996 | Kumar et al. | |
| 5,645,977 A | | 7/1997 | Wu et al. | |
| 5,667,658 A | * | 9/1997 | Koop et al. | ................... 205/50 |
| 5,676,983 A | | 10/1997 | Bacher et al. | |
| 5,944,974 A | | 8/1999 | Fahrenberg et al. | |

FOREIGN PATENT DOCUMENTS

DE  19755712 A1  7/1999
DE  19815130 A1  10/1999

* cited by examiner

*Primary Examiner*—Kathleen Duda
(74) *Attorney, Agent, or Firm*—Birch, Stewart, Kolasch & Birch, LLP

(57) ABSTRACT

Method in connection with the production of a template, preferably for nanoimprint lithography, which template comprises a flat plate (1) of a first material and a three-dimensional structure (6, 8) of a second material, arranged on the plate, said second material introductory being applied on said plate, in the method, to form the structure. The second material is thereafter fixed to the plate the second material is thereafter fixed to the plate of the first material, by heat treatment (Q) at at least 100° C., for the production of the template. A template is produced by use of the method.

11 Claims, 5 Drawing Sheets

US 7,022,465 B2

Figure 1:
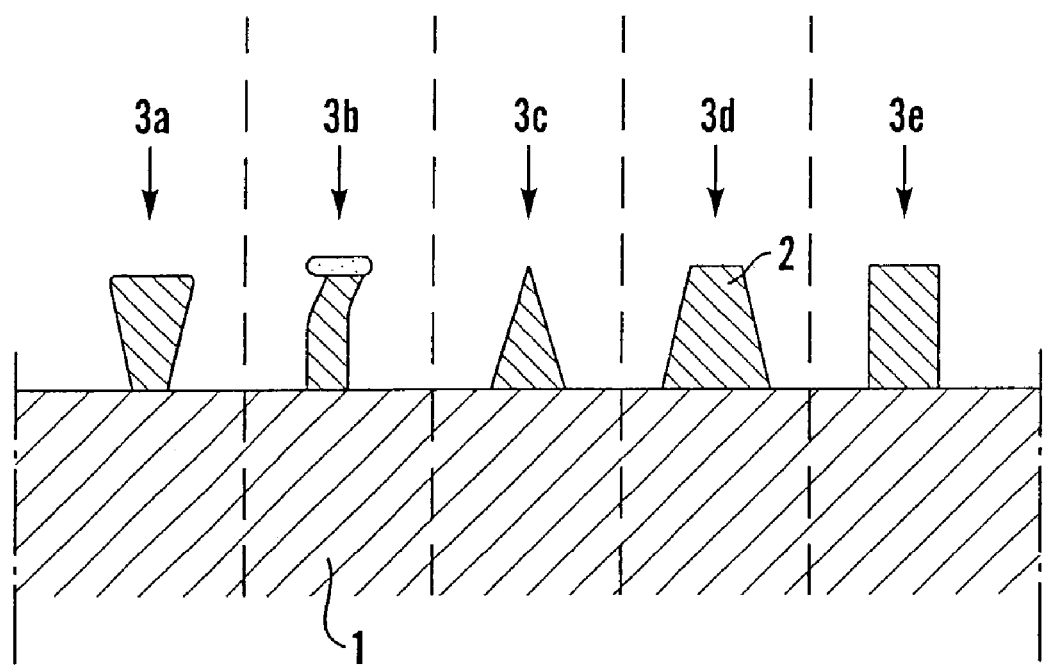

METHOD IN CONNECTION WITH THE PRODUCTION OF A TEMPLATE AND THE TEMPLATE THUS PRODUCED

This application is the national phase under 35 U.S.C. § 371 of PCT International Application No. PCT/SE01/00787 which has an International filing date of Apr. 10, 2001, which designated the United States of America.

1. Technical Field

The present invention relates to a method in connection with the production of a template, which template comprises a flat plate of a first material and a three-dimensional structure of a second material, arranged on the plate, said second material introductory being applied on said plate, in the method, to form said structure. The method has primarily been developed for use in connection with the production of semiconductor components by use of nanoimprint lithography, the template produced according to the method being used as a template in connection with series production of such semiconductor components, but it may also be used in connection with nanoimprint lithography on other rigid materials, such as ceramic materials, metals or polymers with a relatively high glass transition temperature, for us in e.g. biosensors.

2. Prior Art

The trend in microelectronics is towards ever smaller dimensions. In principle, development has been such that the dimensions are halving every third year. Commercial components are being manufactured today with structures of roughly 200 nm in size, but there is a need to go even further down in dimensions, to <100 nm. Research concerning components based on quantum effects is now highly topical and a demand is being created for a commercially applicable manufacturing technique for components with dimensions <10 nm. These nanocomponents can be produced currently using serial technology in individual specimens, for research purposes, but for mass production a parallel production method is required. One such parallel production method that has been developed in recent times is nanoimprint lithography (NIL), U.S. Pat. No. 5,772,905, which has set out the basic preconditions for the mass production of structures close to atomic scale, see Stephen Y. Chou, Peter R. Krauss, Wei Zhang, Lingjie Guo and Lei Zhuang: "Sub-10 nm imprint lithography and application", J. Vac. Sci. Technol. B, Vol. 15, No 6 (1997).

The basic principle of NIL is mechanical deformation of a thin film layer, which is coated onto a flat plate of silicon. The NIL process can be compared with the production process for CDs and can be described in three stages:

1. Production of template: A template can be produced from various materials, e.g. metal, semiconductor, ceramic or from certain plastics. To create a three-dimensional structure on one surface of the template, various lithographic methods can be used, depending on the requirements for the size of the structures and their resolution. E-beam and X-ray lithography are normally used for structure dimensions that are less than 300 nm. Direct laser exposure and UV lithography are used for larger structures.
2. Imprint: A thin layer of a polymer, e.g. polyamide, is applied to a flat substrate of silicon. The layer is heated and at a certain temperature, the so-called imprint temperature, the predefined template and substrate are pressed together, the inverse of the template's structure being transferred in the polymer layer to the substrate. After a lowering of the temperature, the template is separated from the substrate.
3. Structure transfer: In the areas pressed together in the polymer layer, a thin layer of polymer remains. The last stage is removal of this thin remaining layer on the substrate. This is carried out in a so-called "RIE" or $O_2$ plasma unit. The thinner this remaining layer is, the finer the structures that can be created using the nanoimprint process.

A known method which is used in step 1, i.e. the production of the template, is so called plating, more specifically electroplating. In that method, a flat plate of a semiconductor material or glass is coated by a layer of a polymeric material, a so called resist, preferably a positive resist. A positive resist is defined in this connection in that parts of the polymeric resist material, which have been exposed to radiation, may be removed by a developing process, usually a developing bath. By radiation, e.g. by electron beam, UV radiation, exposure to laser or X-ray, there is defined a pattern in nanometer size in the resist, whereafter the resist is developed in the radiated parts thereof, according to the pattern, so that the plate is exposed in these parts. A thin layer of a metal, e.g. Cr, Au, Ag or Al, is thereafter applied on the exposed parts of the plate and also on the remaining parts of the resist. The metal is thereby applied in a layer which is adequately even and covering in order to thereafter be able to be evenly contacted for an even voltage distribution, in a subsequent electroplating process. In such an electroplating process, the metal layer constitutes an electrode on which a thicker layer (typically of about 300 µm) of e.g. Ni is built up during the electroplating. The Ni layer which has been built up is thereafter separated from the plate with the resist and the thin metal layer, simply by pulling them apart from each other, whereafter the Ni layer is ready to constitute the desired template. In this method, the structures in the template may be brought to exhibit a height of usually about 110–130 nm, but possibly up to 300 nm. The problem of the method is however that it comprises many steps, having many parameters that have to be tuned in. Furthermore, it is often hard to achieve an adequately even voltage distribution in the plating and moreover, it is not possible to produce very small structures, which is ever more required following the development in the field.

Another method which is used in the production of a template is so called etching. In this case, a flat plate of a semiconductor material, silicon/silicon dioxide, is coated by a polymeric material, a so called resist, preferably a positive resist. A pattern in nanometer size is defined in the resist by radiation, whereafter the resist is developed in the radiated parts thereof, according to the pattern, so that the plate is exposed in these parts. A metal, e.g. Cr, is thereafter applied on the exposed parts of the plate, whereafter the remaining parts of the resist are removed in a lift-off process. The desired three-dimensional structure may now be developed by etching, by plasma etching, whereby the metal according to the pattern constitutes a mask. Accordingly, the etching is performed in the semiconductor material and the structure is formed in this semiconductor material with the metal as a top layer on the separate elements of the structure. A problem which quite often arises thereby is that the etching also acts in a lateral direction to a certain degree, causing that the metal material forms a "hat" that somewhat protrudes outside every separate element of the structure. This "hat" risks to get caught in the polymeric material on the substrate in connection with imprint step no. 2 according to the above, which results in an unacceptable result of the imprint.

Up to now, it has not been possible to use a template where the three-dimensional structure only consists of a metal material which is applied according to the first steps in the etching method just described, i.e. the steps up to and including the lift-off process. This depends on the fact that the metal, which in that case would be applied in greater thickness, is too loosely adhered to the plate. Accordingly, parts of the structure come loose from the plate whereby the template soon becomes useless for its purpose.

BRIEF DESCRIPTION OF THE INVENTION

The present invention aims at solving the above complex of problems and at presenting a method in connection with the production of a template, preferably for nanoimprint lithography, which method is simple, cheap and repetitive and which yields durable structures of small size and with a beneficial profile for a subsequent imprint step.

These and other purposes are attained by the method according to the invention, as it is defined in the claims.

The template is produced according to the invention by the second, structure forming, material being applied onto the first material, the plate, according to a technique known per se, e.g. by the forming of a pattern in a resist material followed by evaporation of the second material onto the plate, whereby the resist material constitutes a mask. After this, a heat treatment step is conducted according to the invention at at least 150° C. but below the melting temperature for the second material, whereby the structural details are fixed onto the plate, for the formation of a durable template.

Without restricting the invention to a certain theory, it is probable that the desired fixing is achieved by chemical interaction between the surfaces of the first and second material, facing each other. For example, when the first material consists of $SiO_2$ and the second material consists of Cr, it is probable that chromium oxide is formed in the heat treatment, possibly only for a few atoms in the interface layer, which effects a binding between the two materials.

DETAILED DESCRIPTION OF THE INVENTION

Figure 2A:
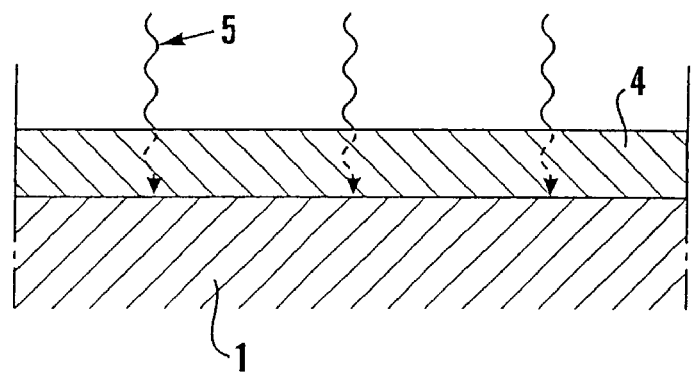
Figure 2B:
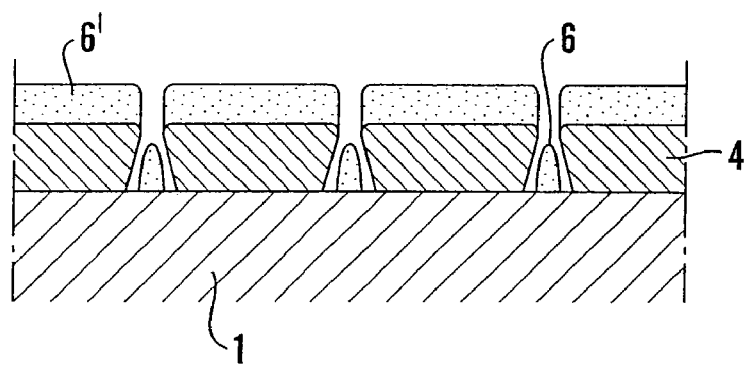
Figure 2C:
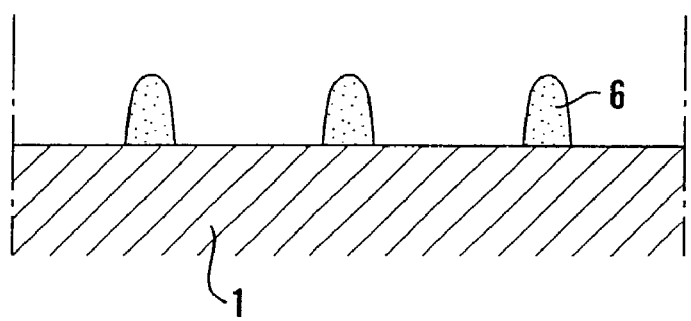
Figure 2D:
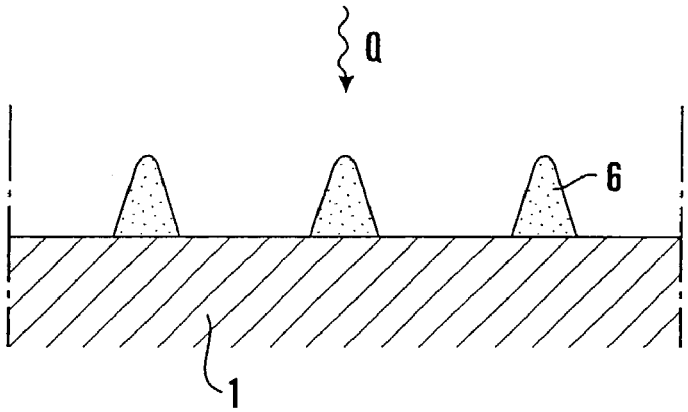
Figure 3A:
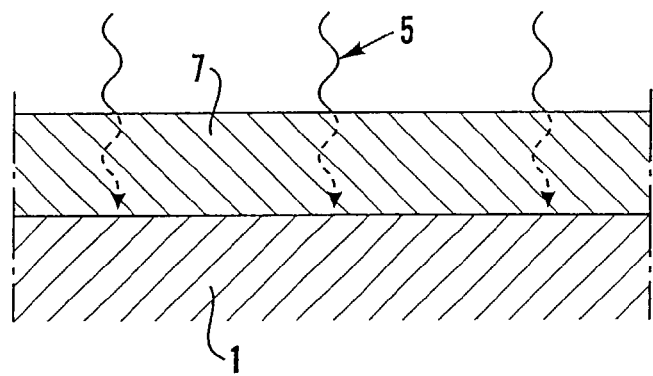
Figure 3B:
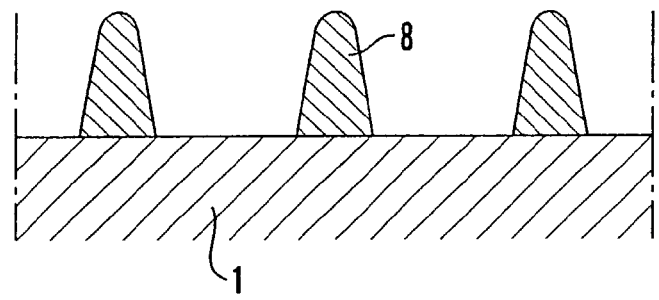
Figure 3C:
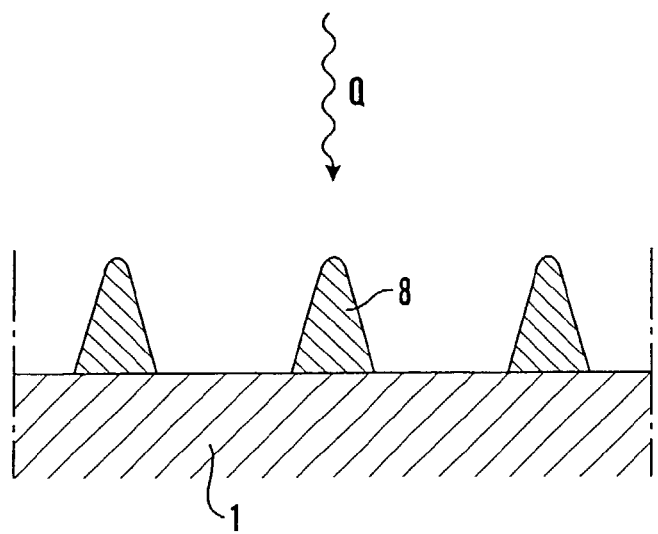
Figure 4A:
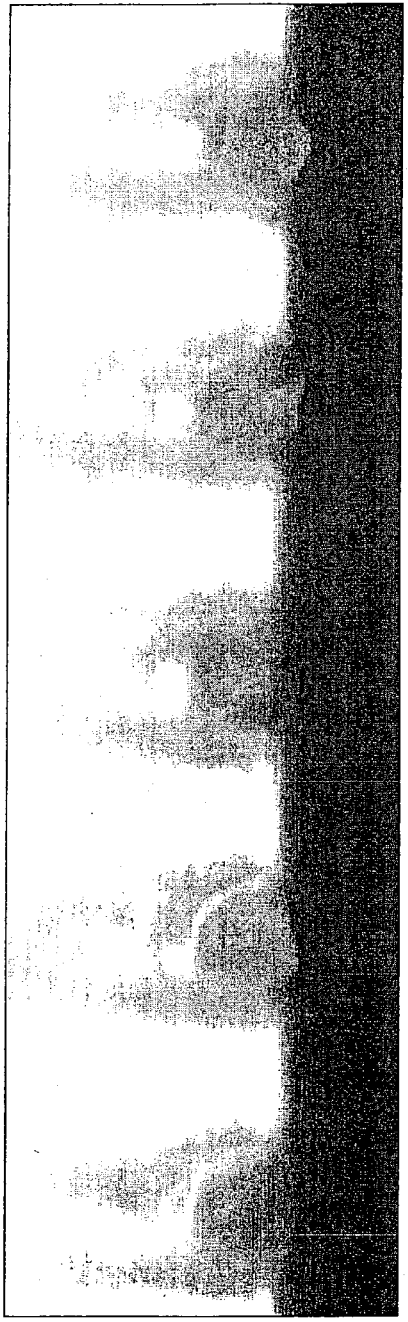
Figure 4B:
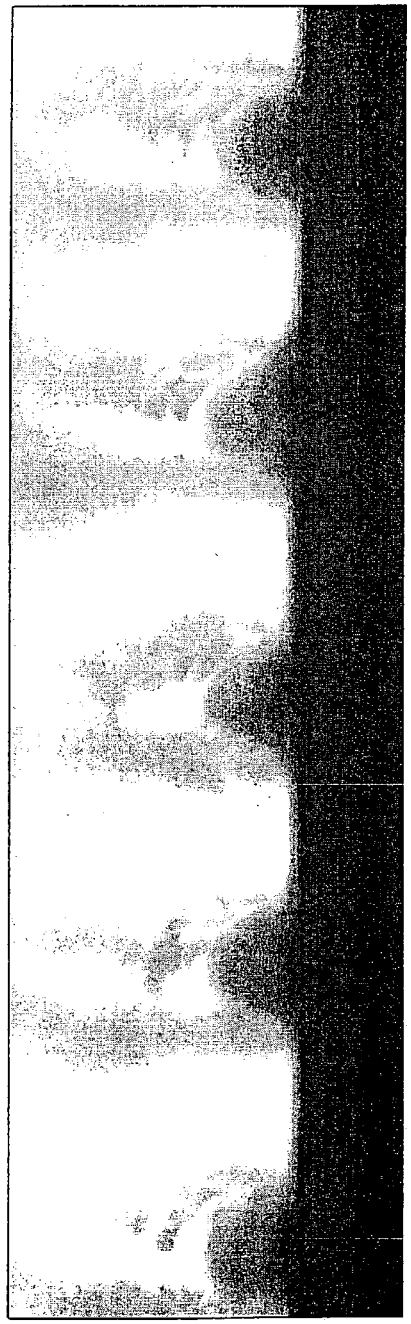
Figure 4C:
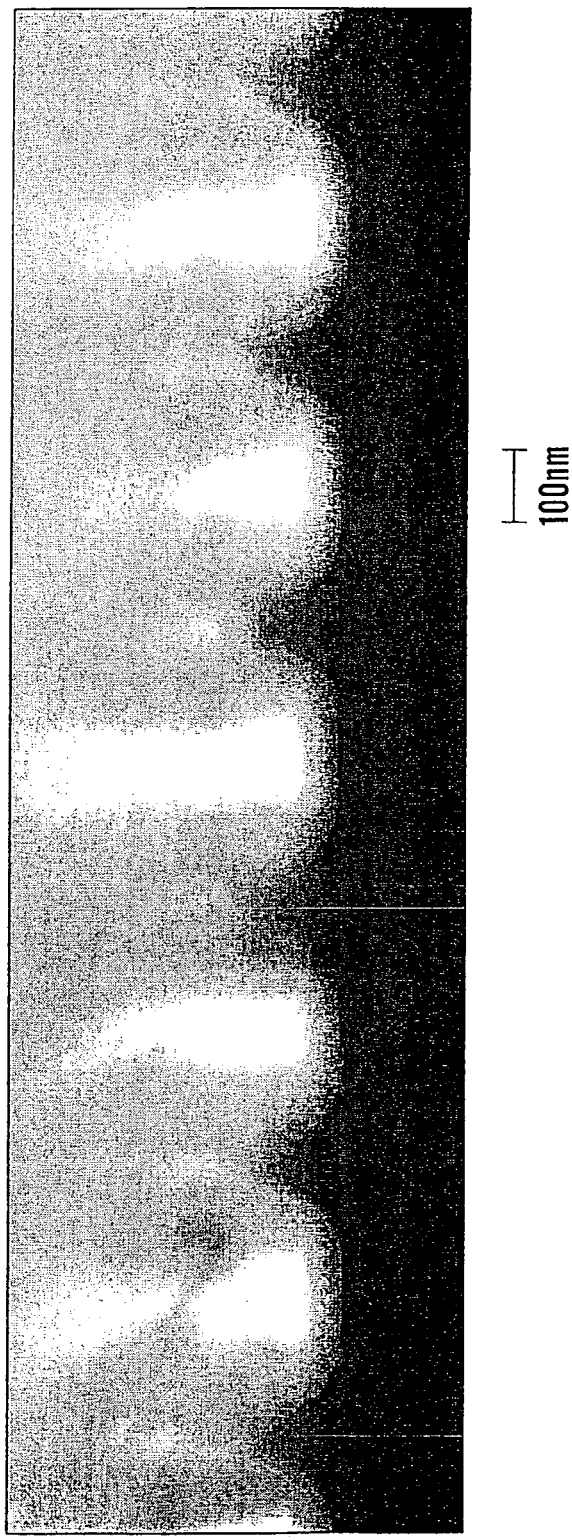

In the following, the invention will be described in greater detail with reference to the drawings, of which:

FIG. 1 is showing, in cross-section, a number of different three-dimensional structures on a template, whereof some are beneficial and others are non-beneficial, FIGS. 2*a–d* is showing, in cross-section, the process steps for the production of a template according to a first embodiment of the invention, FIGS. 3*a–c* is showing, in cross-section, the process steps for the production of a template according to a second embodiment of the invention, FIGS. 4*a–c* is showing, in cross-section and a light perspective, SEM pictures of three different templates which have been produced according to the invention.

In FIG. 1 there is shown, in cross-section, a number of different structural details which may be produced on a template, according to known technique. On a plate 1, there has been produced different imagined structural details 3*a–e*, of a material 2. Detail no. 3*a* exhibits a non-beneficial profile, which after imprint in a resist that has been softened by heating and solidified by cooling, on a not shown substrate, risks to get caught in the resist on the substrate. This is also the case for structural detail no. 3*b*, which has been produced by etching according to the description above of known techniques, and which exhibits a protruding "hat". The structural details 3*c*, 3*d* and possibly even 3*e* are on the contrary beneficial for imprint. Such structural details may be produced by electroplating according to the description above of known techniques, but not in sizes that are small enough and not with sufficient simplicity. According to the invention, there may beneficially be produced structural details according to the preferred examples 3*c* and 3*d*, on a template, in desired small dimensions, in a way that is simple, cheap, durable and repetitive.

In FIG. 2*a* there is shown in cross-section, a plate 1 of a first material, e.g. a metal material, a semiconductor material or a polymeric material. The plate 1 has been coated on one side thereof in a previous step, by a layer 4 of a resist material, suitably a positive resist. The resist material 4 is exposed to radiation 5 which defines a pattern for the desired structure, the radiation 5 preferably consisting of an electron beam. It is however also conceivable to use radiation in the form of e.g. X-ray radiation, laser radiation or UV radiation. The pattern may e.g. consist of lines or dots in the resist material 4. In FIG. 2*b*, the template is shown after the resist material 4 having been developed in a manner known per se, so that the plate 1 is exposed according to the pattern in the radiated parts of the pattern, and after the second material 6 according to the invention having been applied, preferably by evaporation, on the thus exposed parts of the plate 1. The second material 6 consists of a metal material, preferably chosen from the group that consists of Al, Ni, Cr, W, Ti, Au or alloys of the same, e.g. Ti—Au, and is applied with a thickness of about 150 Å–300 nm, for the formation of a three-dimensional structure. Of course, metal 6' will settle on the resist material 4 too, in connection with the evaporation, which however is of no relevance to the invention. In connection with this, it is an advantage of the invention that the thickness of the three-dimensional structure is very easy to control at the evaporation.

In FIG. 2*c*, the rest of the resist material 4 has been removed, as has metal material 6' lying on the same. This has preferably been done by use of a lift-off process, e.g. dissolving in acetone, which process is known per se. The metal material 6 remains on the plate 1 and forms the desired three-dimensional structure, which however is too loosely adhered to the plate 1 at this moment, for the plate 1 with the material 6 to be used as a template.

In FIG. 2*d*, there is shown how the metal material 6 has changed somewhat in profile after a heat treatment step according to the invention, which has been symbolically denoted by a "Q". The profile has thereby, to a slight extent, become more beneficially sloping and moreover, which is most important, the metal material 6 has been fixed to the plate 1, probably by chemical interaction in the interface between the metal material 6 and the plate 1. The heat treatment Q is according to the invention performed at a temperature which is lower than a melting temperature for the metal material 6 and which of course is also lower than a melting temperature for the material of the plate 1. Suitably, the temperature during the heat treatment is at least 200° C., preferably at least 250° C. and even more preferred at least 350° C., but 800° C. at the most, preferably 750° C. at the most and even more preferred 650° C. at the most. Furthermore, the heat treatment is performed during a time period of at least 1 minute, preferably at least 2 minutes and even more preferred at least 5 minutes, but 2 hours at the most, preferably 1.5 hours at the most and even more preferred 1 hour at the most. The heat treatment may take place in an atmosphere containing oxygen, but also in an atmosphere of nitrogen gas, and may be performed in an oven, on a heating plate or in another way.

In FIGS. 3*a–c* there is shown the process steps for production of a template according to a second embodiment of the invention. The plate 1, which may be of the same material as the plate in FIGS. 2*a–d*, has in FIG. 3*a* been coated by a 150 Å–300 nm thick layer of a polymeric material 7, preferably a resist and even more preferred a negative resist, e.g. a negative resist which is sold by Micro Resist Technology GmbH under the name SU8. A negative resist is defined in this connection by the polymeric resist material being cross-linked at exposure to heat or radiation, whereafter non-exposed parts may be removed by aid of a developing process, usually a developing bath of different type depending on the type of resist. The resist 7 is exposed to radiation 5, which defines a pattern for the desired structure, the radiation 5 suitably consisting of an electron beam. It is however also conceivable to use radiation in the form of e.g. X-ray radiation, laser radiation or UV radiation. The pattern may e.g. consist of lines or dots in the resist material 7.

FIG. 3b is showing the template after the resist material 7 having been developed in a manner known per se, so that the non-exposed parts of the resist 7 has been removed. The remaining parts 8 are cured by heat treatment at a temperature that is lower than the temperature for the heat treatment according to the invention, whereafter the structural details 8 are subjected to the heat treatment according to the invention, symbolically denoted "Q". Also in this case, the heat treatment results in a somewhat more sloping profile (FIG. 3c), and in that the structural details 8 are bonded to the plate 1. The heat treatment Q is performed in the same way as has been described with reference to FIG. 2d, but preferably at a temperature which is in a lower part of the defined range, e.g. at about 260–300° C.

In FIGS. 4a–c there is shown three different templates which have been produced according to the first embodiment of the invention, and which accordingly have been heat treated for 10 minutes at 200° C., 400° C. and 600° C., respectively. The three-dimensional structure consists of lines of aluminium applied on a plate of silicon. Already at a heat treatment at 200° C, (FIG. 4a), the metal adheres well to the plate and the profile is good enough for imprint purpose. At a heat treatment at 400° C. (FIG. 4b), the profile of the structural elements has become somewhat more beneficially sloping, and at 600° C. (FIG. 4c) it is evident that the profile is considerably sloping.

Preferably, but definitively not necessarily, the template which is produced is used in a device for lithography of structures of nanometer size, as is described in the co-pending application SE-A0-9904517-1 of the same applicant.

The invention is not limited to the embodiments described above, but may be varied within the scope of the claims. Accordingly, it is realised that the method for the production of a template also may be used in connection with the production of other objects than semiconductor components, biosensors etc., e.g. in connection with the production of CD's (Compact Discs). It is also realised that the second, structure forming, material may be applied onto the first material in other ways, possibly not yet developed. In this connection it is also conceivable that the first and the second material consist of the same material. Furthermore, it is realised that the resist layer which is used in connection with the application of the second material according to the invention, with reference to FIG. 2a, when this second material consists of a metal material, may be formed from more than one layer, e.g. a lower layer of a positive resist and an upper layer of a negative resist, with the purpose of achieving beneficially undercut profiles in the resist material, as is described in the co-pending application SE-A0-0001430-8 of the same applicant.

What is claimed is:

1. A method for producing an imprint template having a durable imprint surface with an imprint relief pattern, said method comprising the following steps:

providing a plate of a first material having a flat surface;
providing an imprint relief pattern of a second material on the flat surface of said flat plate;
fixing said imprint relief pattern of said second material to the plate of said first material, by heating said first and second material at a temperature above about 150° C. and below the melting temperature of said first and second material, thereby forming said durable imprint surface.

2. The method according to claim 1, wherein said first material is chosen from the group that consists of metallic materials, semiconductor materials, ceramic materials or polymeric materials.

3. The method according to claim 1 or 2, wherein said second material consists of a metallic material, preferably chosen from the group that consists of Al, Ni, Cr, W, Ti, Au and alloys of these materials.

4. The method according to claim 3, wherein said step of providing said relief pattern of said second material comprises the steps that (a) said plate is coated with a layer of a resist material on one of its sides,
(b) the resist material in step (a) is exposed to a radiation which defines a pattern for said structure, preferably by means of an electron beam,
(c) the resist material in step (b) is developed so that the plate is exposed according to the pattern, preferably in the radiated parts of the pattern,
(d) said second material is applied, preferably by evaporation, on the exposed parts of the plate, and that
(e) the remaining part of the resist material is removed, preferably in a lift-off process, whereafter said second material remains on the plate and forms said structure.

5. The method according to claim 1 or 2, wherein said second material consists of a polymeric material, preferably a resist material.

6. The method according to claim 5, wherein the step of providing said relief pattern of said second material comprises the steps that:

(a) said plate is coated with a layer of said second material on one of its sides,
(b) the second material in step (a) is exposed to a radiation which defines said structure, preferably by means of an electron beam,
(c) the second material in step (b) is developed so that the plate is exposed according to the pattern, preferably in the non-radiated parts of the pattern, and that
(e) the remaining part of the second material is cured at a temperature which is lower than the temperature for said heat treatment, whereby said second material forms said pattern.

7. The method according to claim 1, wherein said heat treatment is performed at a temperature between about 200° C. and 800° C.

8. The method according to claim 1, wherein said heat treatment is performed during a time period between about 1 minute and 2 hours.

9. The method according to claim 1, wherein said heat treatment is performed in an atmosphere containing oxygen.

10. The method according to claim 1, wherein said heat treatment is performed in an atmosphere of nitrogen gas.

11. The method according to claim 1, wherein said second material is applied at a thickness of 150 Å–300 nm for the formation of said pattern.

* * * * *